US005146508A

United States Patent [19]

Bader et al.

[11] Patent Number: 5,146,508

[45] Date of Patent: Sep. 8, 1992

[54] OMINDIRECTIONAL MODULAR SIREN

[75] Inventors: Joseph F. Bader, Crete, Ill.; Earl W. Gosswiller, Pompano Beach, Fla.

[73] Assignee: Federal Signal Corporation, Oak Brook, Ill.

[21] Appl. No.: 579,307

[22] Filed: Sep. 7, 1990

[51] Int. Cl.[5] ........................ H04R 25/00; H05K 5/00

[52] U.S. Cl. .................................... 381/156; 381/182; 381/188; 381/205; 381/152; 381/192

[58] Field of Search ............... 381/156, 182, 186, 188, 381/205; 340/388; 181/192, 191, 188, 144, 152

[56] References Cited

U.S. PATENT DOCUMENTS

| | | | |
|---|---|---|---|
| D. 305,660 | 1/1990 | Howze | D14/212 |
| 2,550,359 | 4/1951 | Levy | 381/156 |
| 3,842,203 | 10/1974 | Weisberg | 381/156 |
| 4,023,566 | 5/1977 | Martinmaas | 381/188 |
| 4,633,229 | 12/1986 | Iacono et al. | 181/144 |
| 4,796,009 | 1/1989 | Biersach | 381/156 |
| 4,847,590 | 7/1989 | Gosswiller | 381/156 |
| 4,908,601 | 3/1990 | Howze | 181/152 |
| 4,953,223 | 8/1990 | Householder | 381/182 |

FOREIGN PATENT DOCUMENTS 0252337 1/1988 European Pat. Off. ............ 381/156

OTHER PUBLICATIONS

Whelen Engineering Co. brochure, "High-Power Voice and Siren Sysetms," pp. 1, 8, and 9, 1988.

Kockum Sonics brochure, "TYFONIC Sound Emitter type ET 500," 4 pages (undated).

Federal Signal Corporation brochure, "SIRATONE Models EOWS 612 and 1212," Jan. 1988.

Federal Signal Corporation brochure, "Model 2 Omni--directional Siren," May 1990.

*Primary Examiner*—James L. Dwyer

*Assistant Examiner*—Jason Chan

*Attorney, Agent, or Firm*—Leydig, Voit & Mayer

[57] ABSTRACT

An omnidirectional siren having a plurality of hollow modules supported in vertical alignment on a single, central pole. Active modules each enclose a plurality of audio transducers (i.e., compression drivers) and a horn mechanism which guides sound waves from the drivers to an outlet in the lower surface of the module. The drivers are positioned peripherally within each module so that they can be easily accessed for repair or replacement through slots in the peripheral surface of the module.

15 Claims, 4 Drawing Sheets

OMINDIRECTIONAL MODULAR SIREN

TECHNICAL FIELD

The present invention relates generally to outdoor warning sirens and, more particularly, to an omnidirectional modular siren.

BACKGROUND ART

For years, omnidirectional outdoor warning sirens have been available which consist of multiple horns mounted in back-to-back circular arrays. These sirens exhibit lobing problems in their coverage patterns, however, due to cancellation and/or addition of sound waves emanating from the multiple sources. Consequently, rotation of such arrays is necessary to ensure total area coverage.

More recently, omnidirectional modular sirens have become available through companies such as Whelen Technologies, Inc., and Kockum Sonics. Those sirens consist of a plurality of stacked, disc-shaped modules, each active module having an orifice in either its lower or upper surface through which sound waves—generated by an interiorly mounted compression driver/horn assembly—pass and then spread out omnidirectionally. Whelen's sirens have a single driver/horn assembly per active module, with each driver/horn assembly mounted vertically within a module and directed toward an upper orifice. Since only one driver is used in each module by Whelen, each driver must be very powerful (typically 400 watts) and is, therefore, quite expensive. Kockum Sonics, a Swedish company, manufactures sirens having 1-3 drivers per active module, but the specific arrangement of the drivers and their respective horn assemblies within the modules is presently unknown to applicant.

The vertical stack of modules making up a Whelen siren is coupled together by means of an assembly consisting of a plurality of exteriorly mounted, aluminum cast spacers and annular members (as shown in U.S. Design Pat. NO. 305,660) and the Kockum Sonics modules are coupled by means of a plurality of tie rods and spacers. Access to a driver housed within a module, such as for repair or replacement, is possible in either a Whelen or Kockum Sonics siren only by disassembling the module, thus requiring disassembly of all or part of the coupling assembly. Such disassembly, of course, is quite time consuming and costly.

SUMMARY OF THE INVENTION

It is a primary object of the present invention to provide an improved modular siren which is easy and inexpensive to service.

A related object of this invention is to provide an improved modular siren having drivers positioned peripherally within each active module adjacent to covered access openings in the module wall.

A further object of this invention is to provide a modular siren having a plurality of low power drivers in each module.

Another object of this invention is to provide a modular siren having only a single, central support for the modules.

Other objects and advantages of the invention will be apparent from the following detailed description.

In accordance with the present invention, there is provided an omnidirectional siren having a plurality of hollow modules supported in vertical alignment on a single, central pole. Active modules each enclose a plurality of audio transducers (i.e., compression drivers) and a horn mechanism which guides sound waves from the drivers to an outlet in the lower surface of the module. The drivers are positioned peripherally within each module so that they can be easily accessed for repair or replacement through slots in the peripheral surface of the module.

DESCRIPTION OF THE PREFERRED EMBODIMENTS

While the invention will be described in connection with particular preferred embodiments, it will be understood that it is not intended to limit the invention to those particular embodiments. On the contrary, it is intended to cover all alternatives, modifications and equivalents as may be included within the spirit and scope of the invention as defined by the appended claims.

Figure 1:
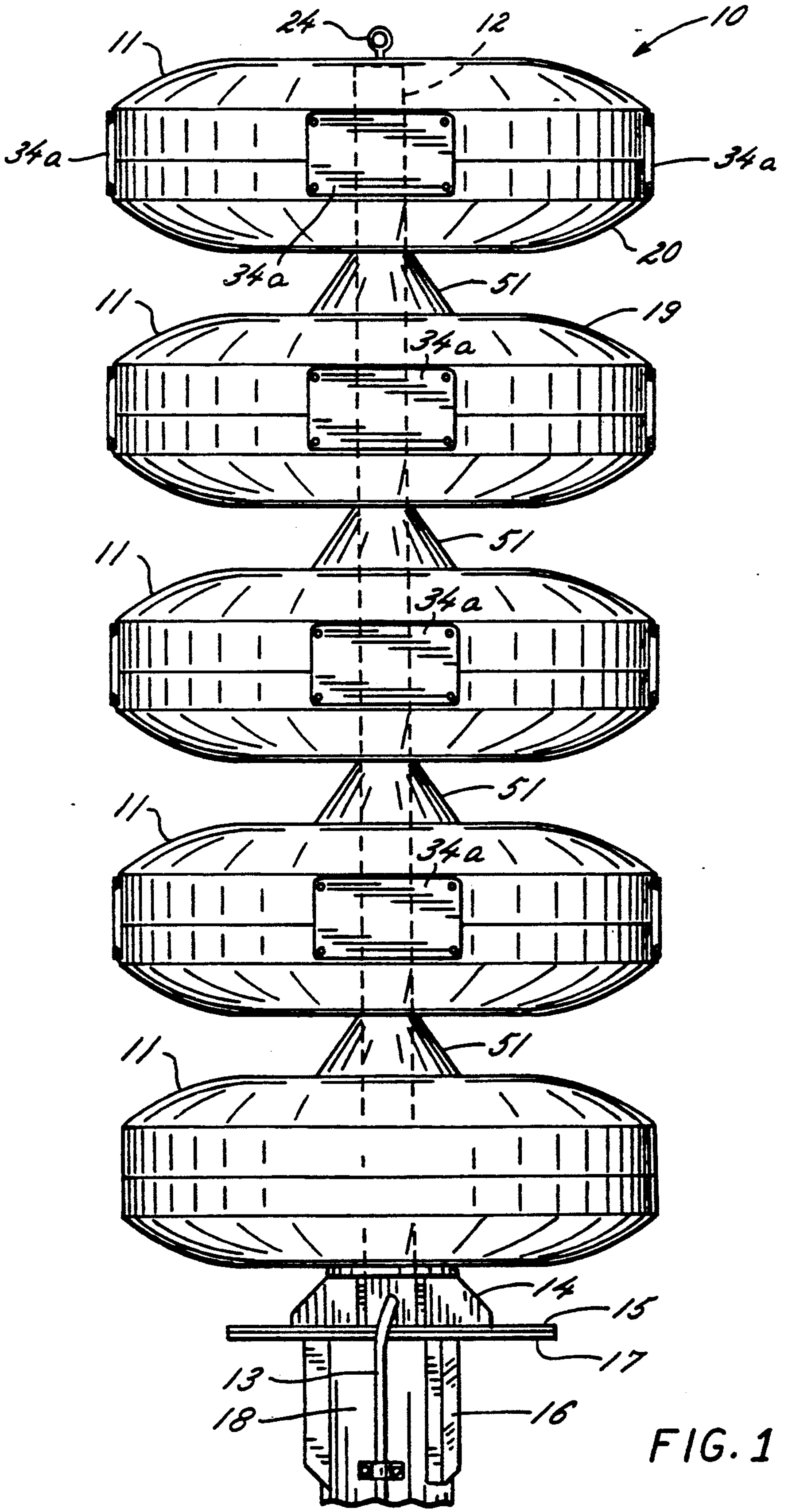
FIG. 1 is a side plan view of a modular siren embodying the present invention.

Turning now to the drawings and referring first to FIG. 1, there is shown an omnidirectional modular siren 10 constructed in accordance with the invention. The inventive siren includes a plurality of housing modules 11—preferably made of aluminum—mounted in spaced-apart vertical alignment on a single, central support pole 12. The embodiment of the inventive siren 10 shown in FIG. 1 has five such modules 11, but it should be noted that the siren can have more than five modules or as few as two, depending on its specific intended use. So that it can receive and provide a passage for electrical wires 13 and yet, on its own, provide adequate support for the plurality of modules, the support pole 12 is preferably a hollow pipe made of steel (or some other metal) having an outer diameter of approximately four inches.

A first bracket 14 having an annular flange 15 is connected to the lower end of the support pole 12, thereby providing means for attaching the siren to a supporting structure. As shown in FIG. 1, a second bracket 16 having a corresponding annular flange 17 is coupled to an underlying support structure 18, such as a wooden pole, and the siren is connected to the support structure by bolting or otherwise fastening the two annular flanges 15, 17 to one another.

Figure 2:
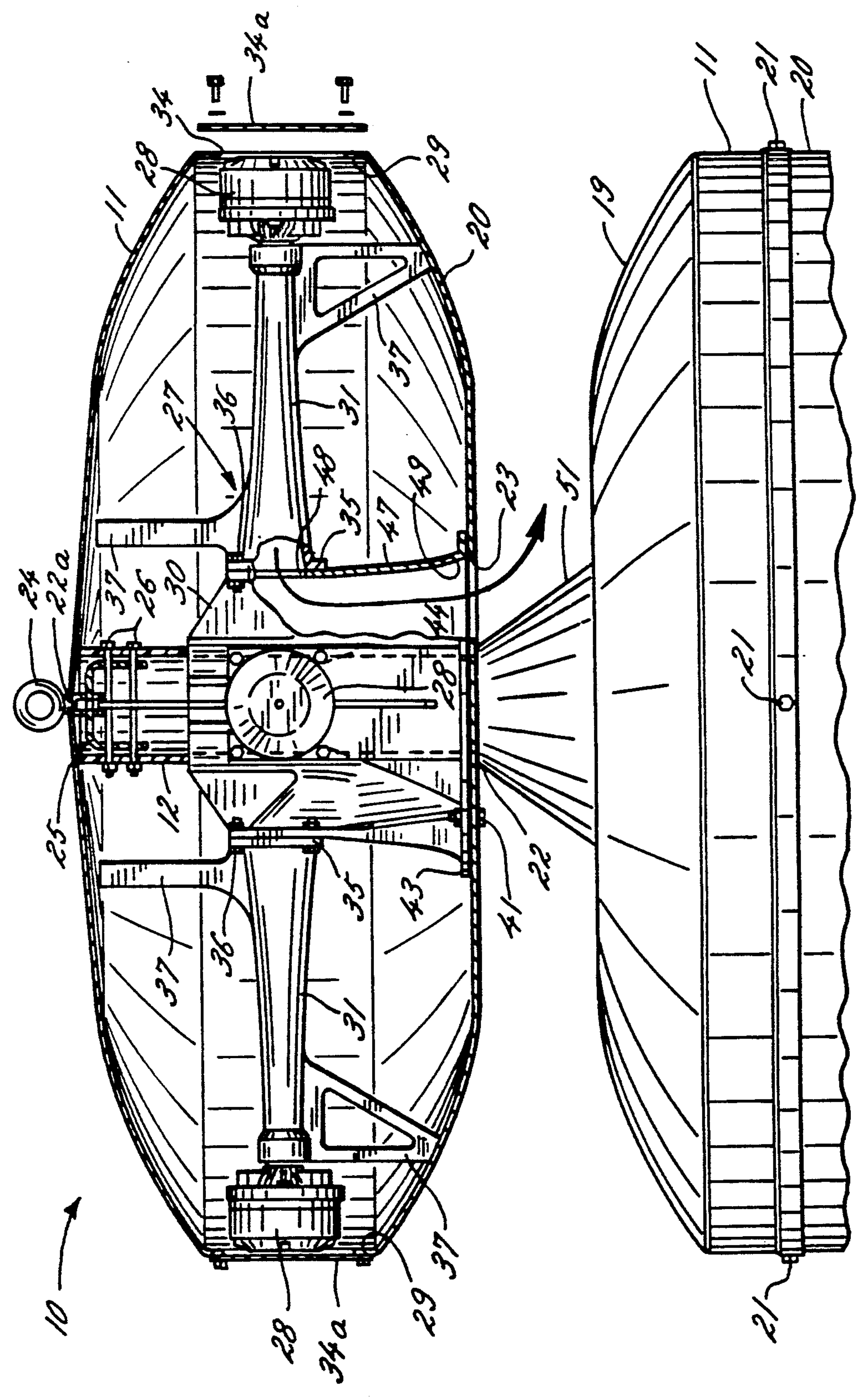
FIG. 2 is a cross-sectional view of the uppermost module in the modular siren of FIG. 1.

Each of the modules 11 consists of an upper, female dish-shaped portion 19 and a lower, male dish-shaped portion 20 which are coupled in edgewise mating relation and fastened together by screws or rivets 21 to form a hollow cavity (see FIG. 2). Apertures 22, 23 are provided in the top and bottom surfaces of each module, permitting the support pole 12 to extend therethrough. The aperture **22*a* in the top surface of the upper module is quite small, of course, so as to keep out dust and precipitation and yet provide a through-hole for a lifting ring 24 which is connected by means of a bracket 25 and bolts 26 to the support pole 12**.

Figure 3:
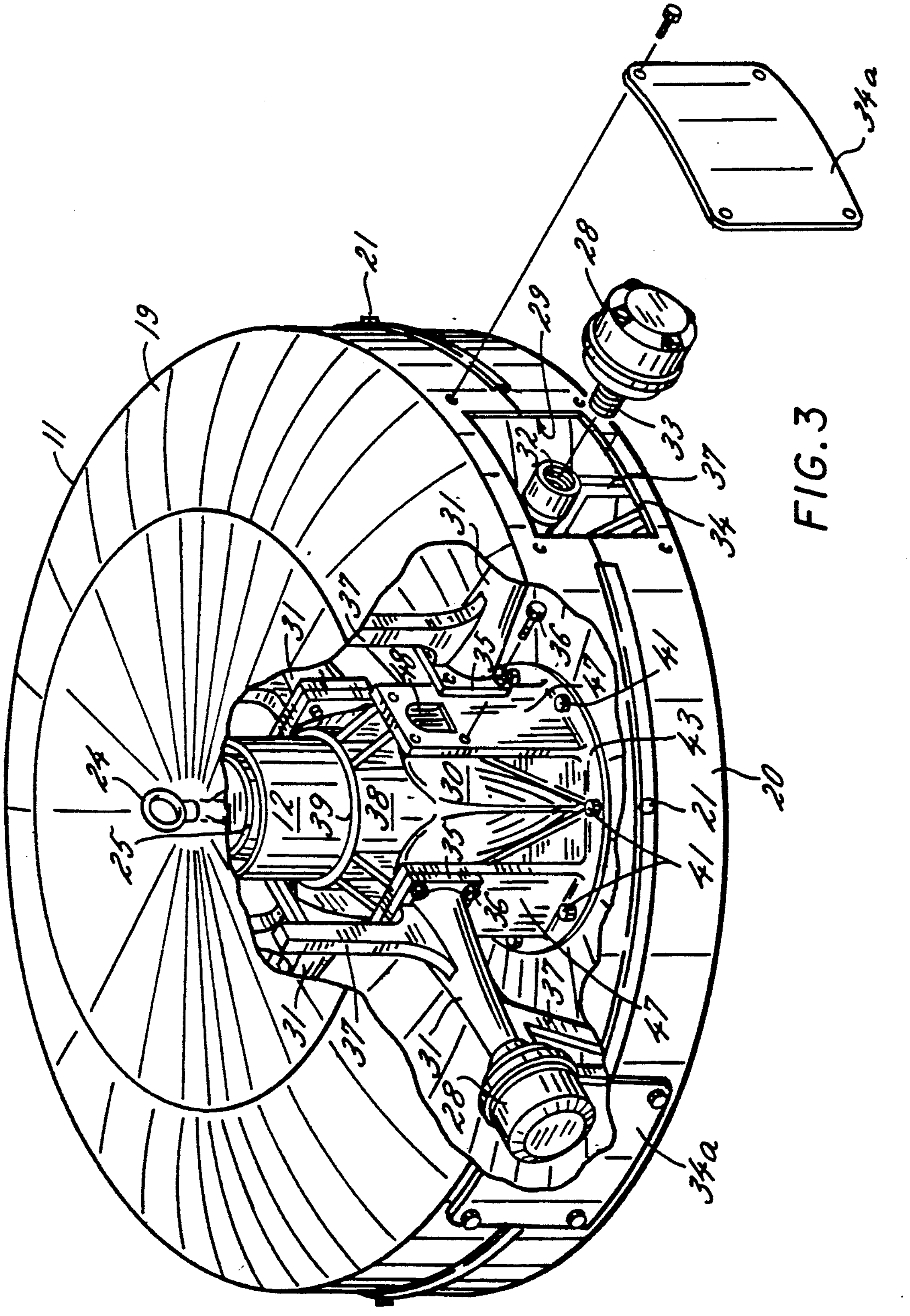
FIG. 3 is a partially sectional perspective view of the driver/horn assembly of the module shown in FIG. 2.

All of the modules—except the bottom one in the vertical stack—are active, containing electrically-powered sound wave producing elements, as shown in FIGS. 2 and 3. The lower apertures 23 in these active modules are larger in diameter than the diameter of the support pole 12, thereby providing an annular port for emission of sound waves from the module.

In accordance with one important aspect of the present invention, each active module has a horn mechanism 27 which is configured so as to support a plurality of audio transducers (i.e., compression drivers) 28—preferably four standard 100 watt drivers—near the peripheral surface 29 of the module. More specifically, the horn mechanism 27 comprises a central manifold 30 and a plurality of waveguide horns 31, coupled together in a hub-and-spoke type arrangement (see FIG. 3).

Each of the waveguide horns 31 has a female threaded section 32 at its outwardly-facing end for removably receiving the male threaded portion 33 of a compression driver 28. This type of threaded connection between the waveguide horns 31 and drivers 28 permits easy removal of the peripherally-positioned drivers from the module 11 through peripheral access slots 34 (normally covered by removable plates 34*a*), thereby greatly reducing the time and expense required to service or replace the drivers. The other end of each waveguide horn 31 terminates in an annular flange 35, by which the waveguide horn 31 can be connected—such as with bolts 36—to the manifold 30.

In the preferred embodiment of the inventive siren, each waveguide horn 31 further has a pair of vanes 37 extending therefrom, which provide internal support to prevent deformation of the surfaces of the module 11. These vanes can, of course, take any of a variety of configurations. Also, as can be readily appreciated by those skilled in the art, it is preferred acoustically that the internal area of each of the waveguide horns 31 increases hyperbolically in the direction of sound wave travel.

The manifold 30 in each active module includes a central wall 38 which forms an annular longitudinal passage 39 through which the support pole 12 slideably extends. Bolts or other appropriate fasteners (not shown) are interposed through transverse holes 40 (see FIG. 6) in the wall 38 of the manifold 30 and through aligned holes (not shown) in the support pole 12 to secure the manifold to the pole. Similarly, the lower portion 20 of a module 11 is rigidly secured to the bottom of each manifold 30 by means of bolts 41 extending through receiving holes 42 in a lower flange 43 of the manifold and aligned holes (not shown) in the module surface.

Figure 5:
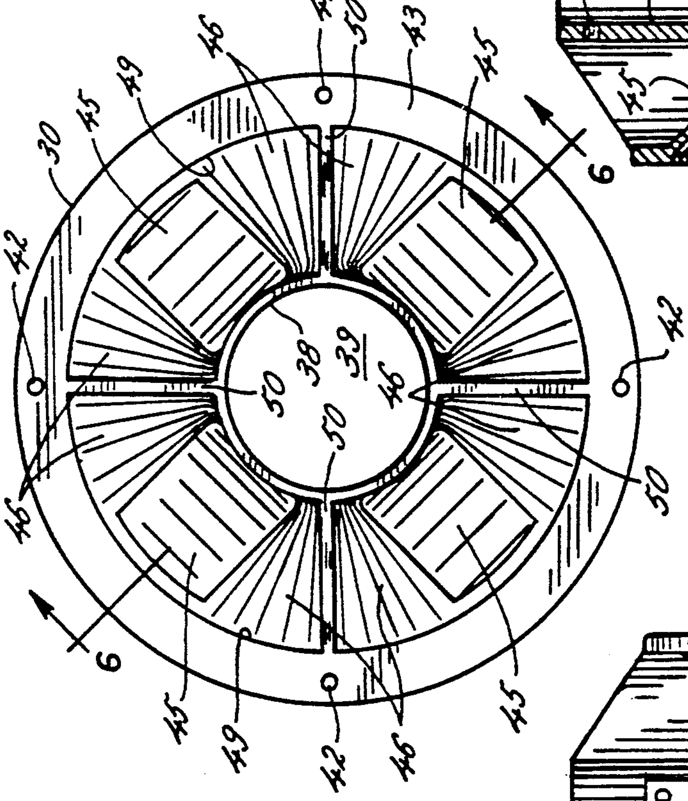
FIG. 5 is a bottom plan view of the horn manifold taken along the line 5—5 in FIG. 4.
Figure 6:
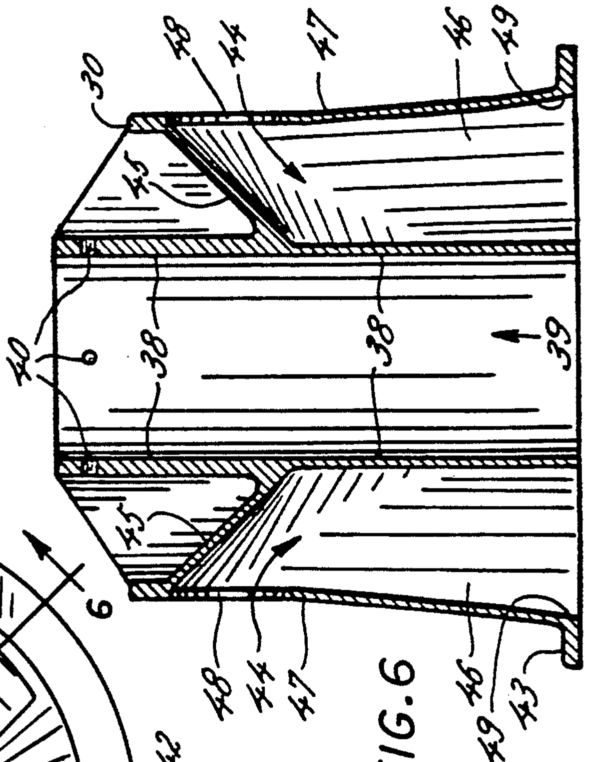
FIG. 6 is a cross-sectional view of the horn manifold taken along the line 6—6 in FIG. 5.
Figure 4:
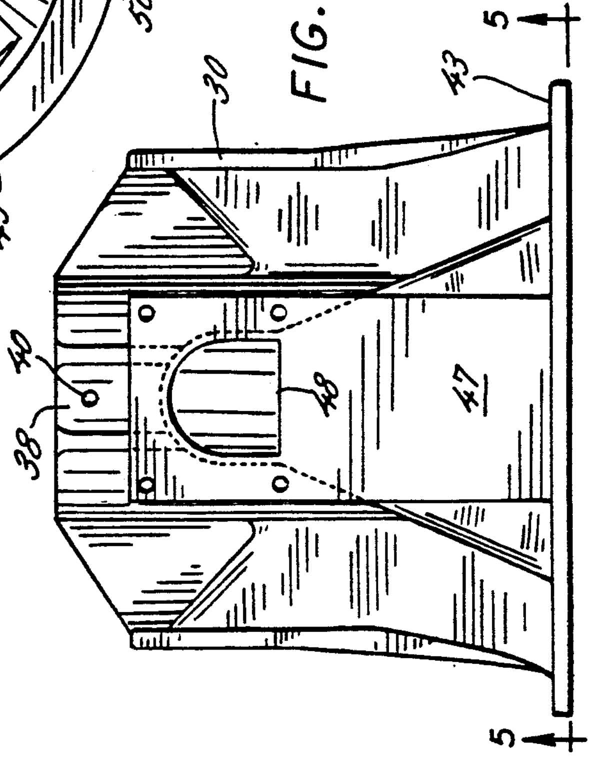
FIG. 4 is a side plan view of the horn manifold of the present invention.

As shown in FIGS. 4–6, each manifold 30 further includes a plurality of waveguide passages 44, preferably having one such passage for each compression driver (i.e., transducer) 28 mounted in the module 11. These waveguide passages 44 are each defined by a portion of the central wall 38 of the manifold, a reflecting surface 45, side walls 46 and an exterior wall 47. Sound waves generated by a transducer 28 and propagated through an associated horn waveguide 31 are introduced into a manifold waveguide passage 44 through an inlet port 48 in the exterior wall 47, reflect downwardly off the surface 45 (which is preferably angled at about 45° to the incident sound waves) and exit from the waveguide passage 44 through a port 49 at the bottom of the manifold, propagating through the passage generally in the direction of the arrow in FIG. 2.

In the preferred embodiment, the four waveguide passages 44 in the manifold 30 all expand hyperbolically in the direction of sound wave travel and terminate adjacent to one another. Indeed, as shown in FIG. 5, adjacent waveguide passages are separated only by a thin wall 50 at the bottom of the manifold, thus defining the substantially annular output port 49 which corresponds with the annular sound wave emission port 23 of a module 11.

The annular sound wave emission port 23 should typically be covered with a mesh screen (not shown) to prevent debris from getting inside and blocking the manifold waveguides 44.

Sound waves emanating from the annular port 23 reflect laterally off a reflecting member 51 and spread out omnidirectionally. The reflecting members 51 are preferably conical in shape and comprise integral protuberances of the upper portions 19 of the modules 11. Spreading of the resulting omnidirectional sound wavefronts is acoustically enhanced by utilization of modules 11 which have hyperbolic outer surfaces (i.e., hyperbolic upper and lower portions 19, 20).

As can be seen from the foregoing detailed description, this invention provides an improved omnidirectional siren having only a single, central support for a plurality of modules. Audio transducers are mounted peripherally within the modules and are, therefore, easy and inexpensive to service or replace through peripheral access slots in the modules

What is claimed is:

1. An omnidirectional siren, comprising:
   - a support column;
   - a plurality of hollow modules supported in spaced-apart, vertical alignment on the support column, each module having apertures in both its top and bottom surfaces through which the support column extends;
   - each but one of the modules being active due to enclosure of a plurality of sound wave producing transducers, the transducers being mounted peripherally within the active modules so as to be accessible through access slots in the peripheral surfaces of the modules, wherein one of the apertures in each of the active modules is larger in diameter than the support column extending therethrough, thereby providing an annular port for emission of sound waves form the module; and
   - means in each active module for guiding sound waves from the enclosed plurality of transducers to the annular sound wave emission port, the means including:
     - (a) a manifold having a longitudinal passage through which the support column extends and a plurality of waveguides through which sound waves travel, wherein each waveguide includes a separate input port for receiving sound waves from a transducer and the plurality of waveguides terminate adjacent to one another and form an annular output port which cooperates with the annular sound wave emission port of the module; and
     - (b) a plurality of waveguide horns which couple the plurality of transducers to the input ports of the manifold waveguides.

2. The omnidirectional siren of claim 1, further comprising reflecting members positioned on the support column between adjacent modules so as to omnidirectionally reflect sound waves emanating from the annular sound wave emission ports.

3. The omnidirectional siren of claim 2 wherein said reflecting members are substantially conical.

4. The omnidirectional siren of claim 2, in which each module has upper and lower dish-shaped portions coupled in edgewise mating relation, wherein the apertures forming the annular sound wave emission ports are locate din the lower portions of the modules and the reflecting members are integral protuberances of the upper portions of the modules.

5. The omnidirectional siren of claim 1, wherein each active module encloses four transducers.

6. The omnidirectional siren of claim 5, wherein 100 watt transducers are utilized.

7. The omnidirectional siren of claim 1, wherein the waveguide horns and the manifold waveguides all expand hyperbolically in the direction of sound wave travel.

8. The omnidirectional siren of claim 4, wherein the upper and lower dish-shaped portions of the module each has a hyperbolic surface.

9. The omnidirectional siren of claim 1 having two modules, only one of which is active.

10. The omnidirectional siren of claim 1 having three modules, two of which are active.

11. The omnidirectional siren of claim 1 having four modules, three of which are active.

12. The omnidirectional siren of claim 1 having five modules, four of which are active.

13. The omnidirectional siren of claim 1 having seven modules, six of which are active.

14. An omnidirectional siren, comprising:

a single elongated support pole;

a plurality of hollow modules supported in spaced-apart, vertical alignment on the support pole, each module having apertures in both its top and bottom surfaces through which the support pole extends;

each but one of the modules being active due to enclosure of a plurality of sound wave producing transducers, wherein one of the apertures in each of the active modules is larger in diameter than the support pole extending therethrough, thereby providing an annular port for emission of sound waves from the module; and means in each active module for guiding sound waves from the enclosed plurality of transducers to the annular sound wave emission port, the means including:

(a) a manifold having a longitudinal passage through which the support column extends and a plurality of waveguides through which sound waves travel, wherein each waveguide includes a separate input port for receiving sound waves from a transducer and the plurality of waveguides terminate adjacent to one another and form an annular output port which cooperates with the annular sound wave emission port of the module; and (b) a plurality of waveguide horns which couple the plurality of transducers to the input ports of the manifold waveguides.

15. The omnidirectional siren of claim 14, wherein the sound wave producing transducers are mounted peripherally within the active modules so as to be accessible through access slots in the peripheral surfaces of the modules.

* * * * *

UNITED STATES PATENT AND TRADEMARK OFFICE

CERTIFICATE OF CORRECTION

PATENT NO. : 5,146,508

DATED : September 8, 1992

INVENTOR(S) : JOSEPH F. BADER AND EARL W. GOSSWILLER

It is certified that error appears in the above-identified patent and that said Letters Patent is hereby corrected as shown below:

ON THE TITLE PAGE:

[54] TITLE

Delete "OMINDIRECTIONAL" and substitute therefor -- OMNIDIRECTIONAL --.

Column 1, line 1, delete "OMINDIRECTIONAL" and substitute therefor -- OMNIDIRECTIONAL --.

Column 5, line 12, delete "locate din" and substitute therefor -- located in --.

Signed and Sealed this

Twelfth Day of October, 1993

Attest:

BRUCE LEHMAN

Attesting Officer

Commissioner of Patents and Trademarks